(12) United States Patent
Lee

(10) Patent No.: US 8,590,154 B2
(45) Date of Patent: Nov. 26, 2013

(54) VAPOR CHAMBER MANUFACTURING METHOD

(75) Inventor: Ke-chin Lee, Taipei (CN)

(73) Assignee: Zhongshan Weiqiang Technology Co., Zhongshan (CN)

( * ) Notice: Subject to any disclaimer, the term of this patent is extended or adjusted under 35 U.S.C. 154(b) by 229 days.

(21) Appl. No.: 13/090,712

(22) Filed: Apr. 20, 2011

(65) Prior Publication Data

US 2011/0277311 A1 Nov. 17, 2011

(30) Foreign Application Priority Data

May 15, 2010 (CN) .......................... 2010 1 0180396

(51) Int. Cl.
*B21D 53/02* (2006.01)
(52) U.S. Cl.
USPC ..................................... 29/890.032; 29/527.1
(58) Field of Classification Search
USPC .......................................... 29/527.1, 890.032
See application file for complete search history.

(56) References Cited

U.S. PATENT DOCUMENTS

| | | | | |
|---|---|---|---|---|
| 2006/0225282 A1* | 10/2006 | Chung | ...................... | 29/890.032 |
| 2007/0034357 A1* | 2/2007 | Hou et al. | ................. | 165/104.26 |
| 2007/0289134 A1* | 12/2007 | Lee et al. | ................. | 29/890.032 |
| 2009/0249625 A1* | 10/2009 | Hsu et al. | ................. | 29/890.032 |
| 2010/0229394 A1* | 9/2010 | Tsai et al. | ................. | 29/890.032 |
| 2010/0296088 A1* | 11/2010 | Xiao et al. | ...................... | 356/319 |
| 2011/0024085 A1* | 2/2011 | Huang et al. | ............. | 165/104.26 |
| 2011/0024098 A1* | 2/2011 | Lee et al. | ....................... | 165/180 |
| 2011/0259554 A1* | 10/2011 | Yang | ......................... | 165/104.26 |
| 2011/0277964 A1* | 11/2011 | Dai et al. | ................. | 165/104.26 |
| 2011/0314674 A1* | 12/2011 | Yang | ........................ | 29/890.032 |
| 2012/0080170 A1* | 4/2012 | Yang | ......................... | 165/104.26 |
| 2012/0111539 A1* | 5/2012 | Dai et al. | ................. | 165/104.26 |
| 2012/0111540 A1* | 5/2012 | Dai et al. | ................. | 165/104.26 |
| 2012/0227933 A1* | 9/2012 | Chen et al. | ............... | 165/104.21 |
| 2012/0227934 A1* | 9/2012 | Huang | ...................... | 165/104.26 |
| 2012/0305223 A1* | 12/2012 | Yang et al. | ............... | 165/104.26 |
| 2012/0312507 A1* | 12/2012 | Yang | ........................ | 165/104.26 |

FOREIGN PATENT DOCUMENTS

CN 101566440 10/2009

* cited by examiner

*Primary Examiner* — Alexander P Taousakis
(74) *Attorney, Agent, or Firm* — Myers Wolin, LLC

(57) ABSTRACT

A vapor chamber manufacturing method, comprises steps of material preparation, powder filling and sintering, pre-punching, supporting structure infilling, the first pressing, the first sealing, fluid injection, and vacuum processing; a sealing structure comprises a semi-finished vapor chamber with a vacuum cavity, a fluid injection port positioned on one side of the vapor chamber, and a supporting structure filled in the vacuum cavity and supporting the shape of the vapor chamber, wherein the fluid injection port is formed of one portion of one side of the vapor chamber by pressing and sealing, no fine metal pipe as fluid injection port is required herein; after the step of fluid injection, an integrated step of vacuum pumping, pressing and sealing is conducted within a vacuum chamber, to provide the product with higher performance and lower rejection rate.

8 Claims, 9 Drawing Sheets

VAPOR CHAMBER MANUFACTURING METHOD

CROSS REFERENCE TO RELATED APPLICATIONS

The present application claims priority under 35 USC 119 to Chinese Patent Application No. 201010180396.4, filed May 15, 2010, the contents of which are incorporated herein by reference.

FIELD OF THE INVENTION

The present invention relates to a vapor chamber manufacturing method.

BACKGROUND

Nowadays the electronic products on the market are becoming more and more powerful, operating at high speeds can produce a great amount of heat, but the conventional heat dissipating devices used for these products are usually aluminum extruding heat dissipating fins or with fans, which are more or less insufficient for these powerful electronic products. As a result, in the associated industries many manufacturers are continuously to develop new heat dissipating devices using new technologies such as heat pipes and vapor chambers, in which a type of vapor chambers which feature in fluid-vapor two-phase conversion have a widespread use as these vapor chambers provide a wide and flat surface contacting with the electronic products, allowing the heat generated by these electronic products to dissipate in a plane radiation way. In comparison with the unidirectional heat pipe heat dissipating devices, these vapor chamber heat dissipating devices are able to provide better heat dissipation by universal directions, lower heat resistance and higher heat conductivity.

As FIG. 1 shows, a recent vapor chamber usually consists of an upper cover 01, a lower cover 02 and a supporting element 03 disposed between the upper cover 01 and the lower cover 02, in production, all elements are placed between the covers before the covers are pressed. However this technique is rather difficult: if the wall of the covers is too thin, the covers will easily sink along with the supporting element 03; but if the wall of the covers is too thick, the weight of the vapor chamber produced will easily excess the design standard. Moreover, as usually a vapor chamber is quite large, the sides thereof are correspondingly long, therefor any small defects of pressing and welding in these sides may become the potentially risky spots in which the covers may split off in a high temperature. Thus, according to the descriptions above, it is obvious that the conventional manufacturing techniques of vapor chambers are complicated and difficult, consequently low in efficiency and high in manufacturing costs.

A basic configuration for a finished vapor chamber product comprises a cover with a vacuum chamber, in which a microstructure is provided and filled by the working fluid; the heat conduction is realized by the heat absorption and dissipation of the working fluid in condensation and evaporation, and the capillary force generated by the micro structure on the working fluid. In addition, the vacuum in the cavity of the vapor chamber is required, the current producing technologies, whatever the chamber formed of a upper and a lower covers, or the chamber formed of a copper tube shaped, as shown in FIG. 2, all comprise several common steps: a step for powder filling and capillary structure sinter-forming, a step for supporting structure forming and chamber profiling, a step for sealing by argon welding or silver brazing and inserting a fine metal pipe as a fluid injection port, a step for injecting working fluid via the fluid injecting port, and a final step for chamber vacuuming and fluid injection port sealing.

However, the recent vapor chamber manufacturing method described above have the following shortcomings:

Firstly, the vapor chambers or semi-finished vapor chambers produced by foregoing steps all have a fine metal pipe welded in the fluid injection port as a reserved fluid injection pipe, which is shown as FIG. 3, in which 1 is a semi-finished vapor chamber, 101 is the sealing structure, 102 is the fluid injection pipe. The semi-finished vapor chamber with such a structure may be easily damaged because of accidental collision or pressure, consequently to cause higher rejection rate.

Furthermore, in the later manufacturing steps of working fluid injection, vacuum pumping, and sealing, the recent methods use an injector to inject the working fluid into the vapor chamber through the fine metal fluid injection pipe, and then remove the injector when the fluid injected achieves a certain volume, after that pass the semi-finished vapor chamber to another work station for vacuum pumping and sealing. This procedure is rather complicated, time consuming and has higher manufacturing cost.

In addition to above, because of the high vacuum in the cavity of the vapor chamber, the approach of using a same port for fluid injecting and vacuum pumping may result in a phenomenon of the rapid vaporization of the working fluid injected while the working fluid is being injected, which may lead to insufficient working fluid in the vapor chamber and consequently a so-called "dry out" phenomenon.

SUMMARY OF THE INVENTION

The object of the present invention is to provide a vapor chamber with more reasonable structure, higher heat-dissipation efficiency, lower manufacturing costs, and minimized sealing defects.

The vapor chamber disclosed by the present invention comprises a flat metal tube formed of a circular metal tube, a powder sintering portion on the inner wall of the metal tube, a supporting structure positioned in and surrounded by the metal tube, and a certain quantity of working fluid filled in the cavity of the metal tube. Wherein the top side and the bottom side of the metal tube are flat, and the two opposite sides connecting the top side and the bottom side are circular arc shaped, the front side and the back side are sealed by pressing and welding, this configuration provides the smallest total length of the sealing and welding portions, and highest reliability.

The supporting structure is formed by metal injection molding.

As a further modification to the aforementioned embodiment, said supporting structure comprises a plate with a plurality of projections.

As a further modification to the aforementioned embodiment, said projections are alternately distributed on the plate in a trapezoidal wave form.

A vapor chamber manufacturing method comprises following steps:

Step 1, material preparation: preparing raw metal materials for the vapor chamber, and cutting said metal material to predetermined dimensions, inserting a mold rod matched with the internal diameter of said metal tube into the cavity of said metal tube;

Step 2, powder filling and sintering: filling the cavity of said metal material with the raw powder screened, sintering said metal material after filling, and removing said mold rod from said metal tube;

Step 3, supporting structure filling: prepressing said metal tube to a flat shape, and filling the cavity of said metal material with a supporting structure;

Step 4, the first pressing: reserving one portion of an opening of said metal material as a fluid injection port and pressing the rest of portions of the opening;

Step 5, the first sealing: sealing said metal material except the portion of the opening reserved as a fluid injection port;

Step 6, fluid injection: injecting the quantified working fluid into the cavity of said metal material through said fluid injection port; and Step 7, vacuum processing: preparing a vacuum chamber comprising a vacuum pumping device, a pressing device, a seal welding device, and an observation window for the operator to observe the internal conditions therein, placing at least one semi-finished vapor chamber into said vacuum chamber, and pressing and sealing said fluid injection port of said semi-finished vapor chamber.

Wherein, no fluid injection pipe is involved in the above steps, in order to avoid problems of being damaged too easily in manufacturing.

The advantages of adopting the manufacturing steps provided by the present invention could be: in the flattened metal tube provided by the present invention, a metal powder sintering structure is provided, the metal tube is hollow, and filled with a high temperature resistance supporting structure, which can be formed by metal injection molding, and provides higher temperature resistance, lighter weight, and higher hardness than most of other metal structures, and therefore may be the best choice for the supporting structure used in the vapor chamber.

Furthermore, preferably, the surface of said supporting structure is in a wave peak and trough alternating form, allowing a more even spread of the outer force applied on the surface of the vapor chamber and preventing the vapor chamber from collapse or deformation. Resulting from above, the vapor chamber provided by the present invention can effectively and efficiently solve the problems of heat dissipation in use of the high heat producing electronic products, i.e., CPU, GPU, LED or solar cell and etc.

Unlike other existing methods in which an injection pipe is welded into the semi product, the vapor chamber manufacturing method disclosed by the present invention reserves a part of the opening of the metal tube as a fluid injection port after the first sealing in step 5. After the step of fluid injection, the semi-finished vapor chamber is vacuumed and sealed, in detail, the semi product is placed and fixed in a work holder of the vacuum chamber for further processes including the pressing and sealing of the fluid injection port. The fine metal pipe is no longer required in the vapor chamber produced by such steps, thereby avoiding problems of being unable to inject fluid due to the damage on it caused by accidental collision and pressure during manufacturing. This method allows an integrated operation of vacuuming and sealing in the vacuum pumping chamber, eliminating the disadvantages caused by the pressure difference between the interior and exterior of the cavities of the vapor chamber, and providing products with higher quality, lower rejection rate and enhanced heat dissipating performance.

Those skilled in the art would be able to understand the other advantages and objects of the present invention after reading this disclosure.

BRIEF DESCRIPTION OF THE DRAWINGS

The advantages, features, and exemplary embodiments of the present invention will be better understood by the following description when considered in conjunction with the accompanying drawings in which.

DETAILED DESCRIPTION

Figure 1:
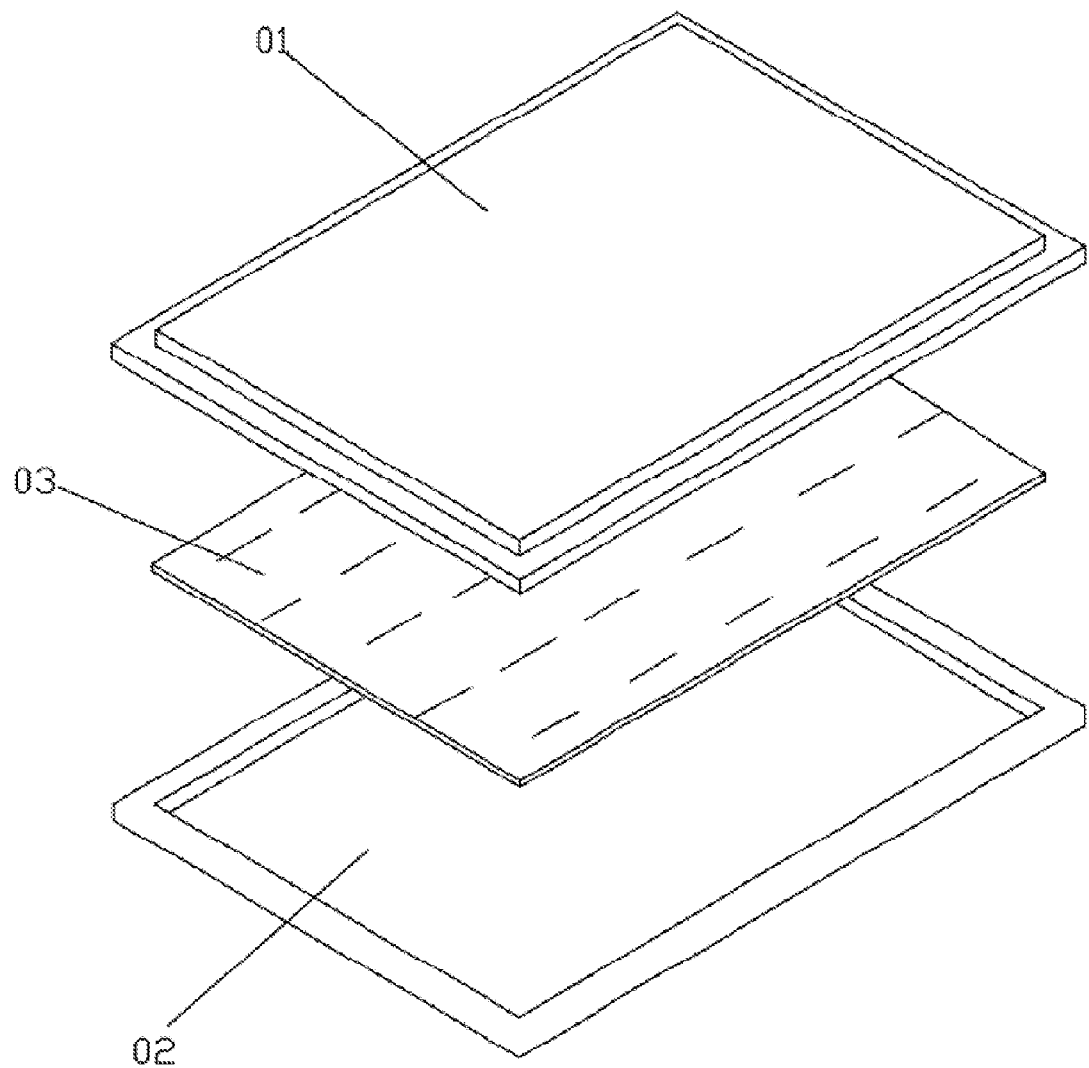
FIG. 1 is an exploded view of an existing vapor chamber.
Figure 2:
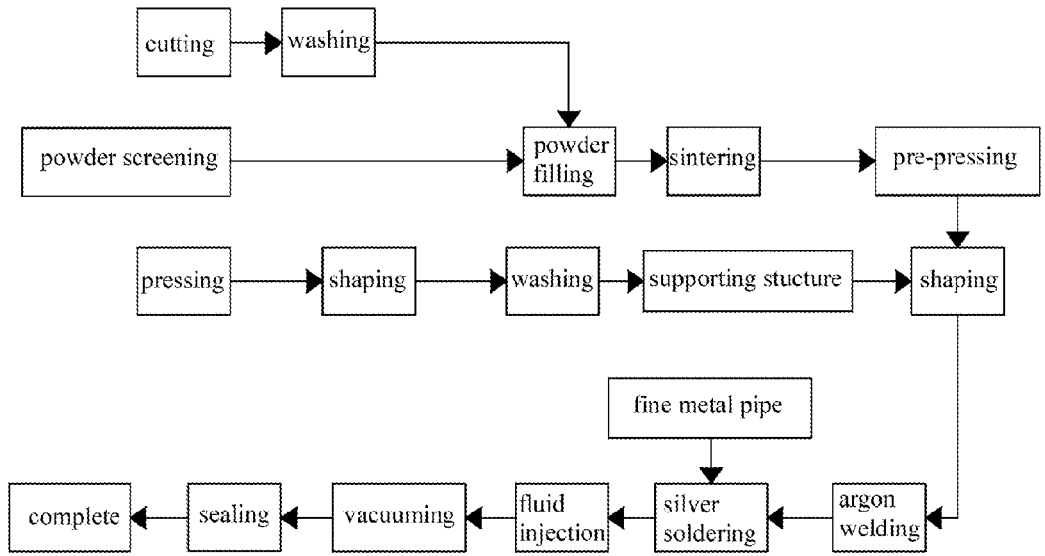
FIG. 2 is a flow diagram of an existing vapor chamber manufacturing method.
Figure 3:
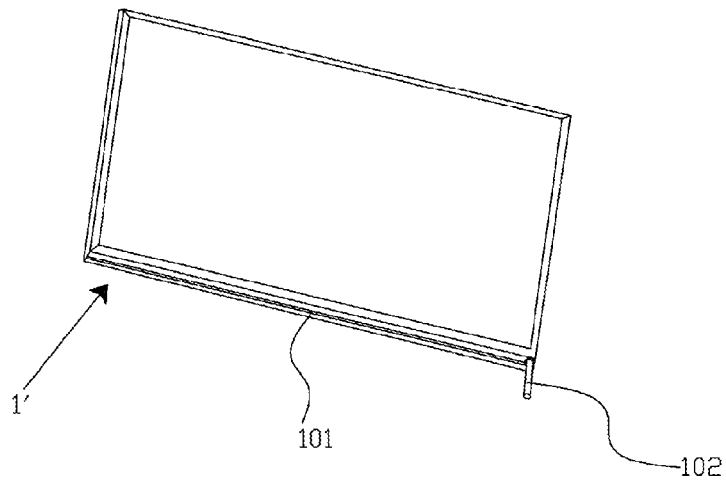
FIG. 3 is a schematic view of a semi-finished vapor chamber produced by an existing manufacturing method.
Figure 4:
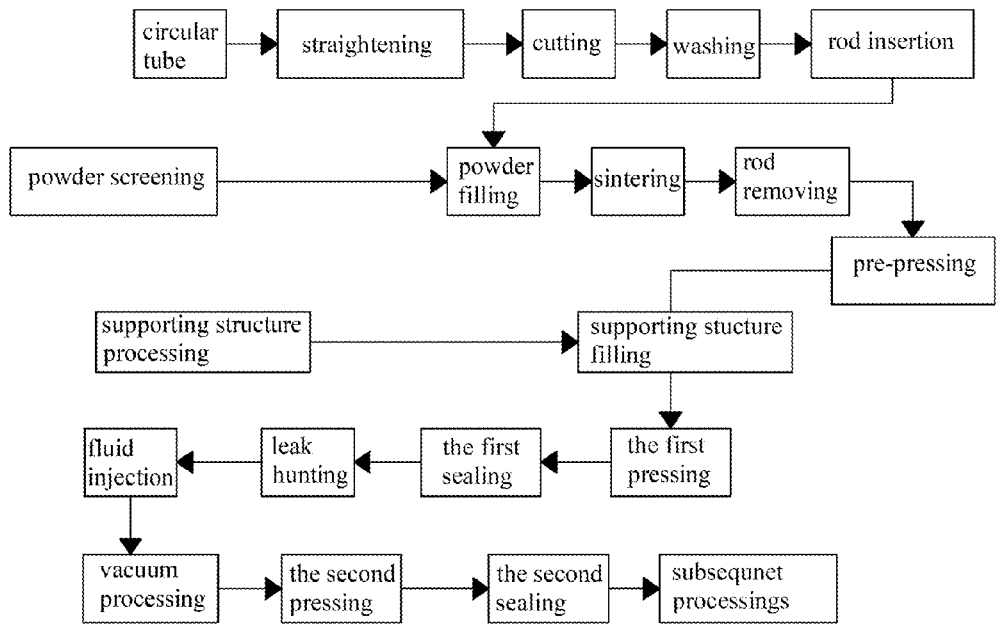
FIG. 4 is a process flow diagram of the first embodiment of the present invention.

As shown by the process flow diagram of the first embodiment of the present invention in FIG. 4, wherein the metal material used in this embodiment is a metal tube, the method comprises the following steps:

Step 1, material preparation: preparing the metal material of the vapor chamber, and cutting the material to predetermined dimensions; as using metal tube, some sub-steps for processing the metal tube are includes:

Cutting: cutting the raw metal tube to predetermined size, straightening the raw metal tube before cutting to ensure the yield of the final product, and washing the metal tube after cutting to ensure the quality of the cavity of the metal tube; and Rod insertion: inserting a mold rod matching with the internal diameter of the metal tube into the cavity of the metal tube, wherein the mold rod will be sintered with the raw powder in a later step to form the required structure in the cavity of the metal tube.

Step 2, powder filling and sintering: filling the cavity of the metal tube with the raw powder screened, and sintering the raw powder therein to form a capillary structure; this step can be further divided into several sub-steps:

Powder filling: filling the cavity of the metal tube with the raw powder through an opening of the metal tube;

Sintering: sintering the metal tube with the raw powder therein; and

Rob removing: removing the mold rod from the metal tube.

Step 3, supporting structure filling: filling the cavity of the metal tube with a supporting structure; as in this embodiment the metal tube is used, this step is further divided into:

Pre-pressing: pressing the metal tube to form a flat tube;

Supporting structure filling: filling the cavity of the metal tube with the supporting structure through an opening of the metal tube, wherein the supporting structure is formed by punching, shaping and washing, and provides support for the metal tube.

Step 4, the first pressing: the metal tube has a first and a second opening respectively on the ends thereof, in this step, one portion of the first opening is reserved as a fluid injection port 100, and the rest of the first opening and the second opening are pressed.

Figure 6:
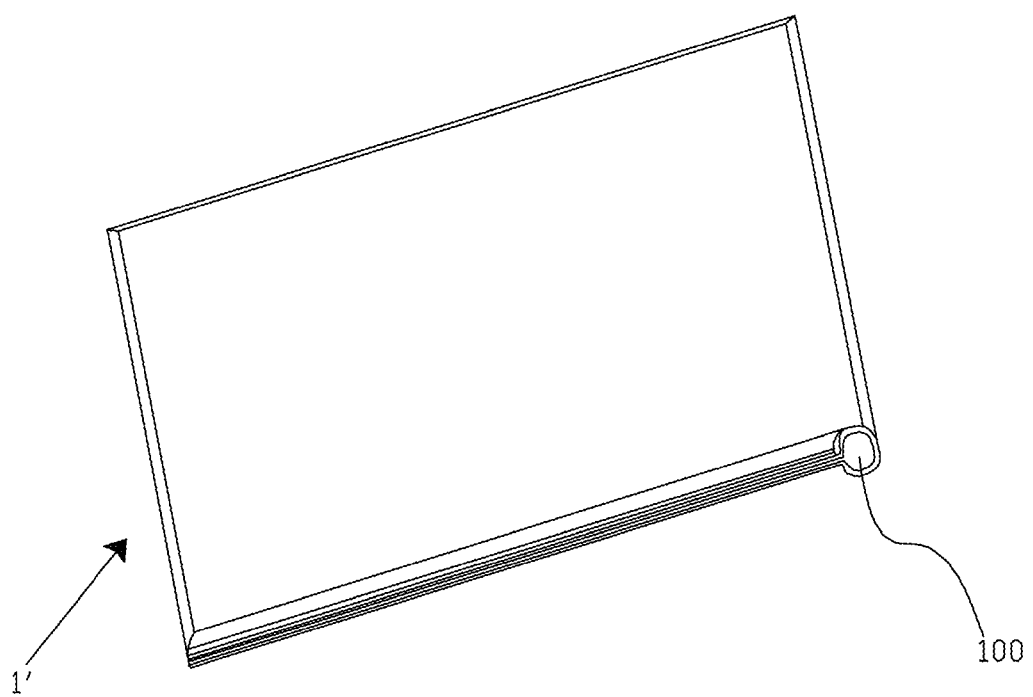
FIG. 6 is a schematic view of a semi-finished vapor chamber produced by the method provided by the present invention.

Step 5, the first sealing: sealing the metal tube except the portion reserved as the fluid injection port 100 to form a semi finished vapor chamber, shown as FIG. 6, wherein 1 is the semi finished vapor chamber, 100 is the fluid injection port.

Step 6, fluid injection: injecting the quantified working fluid into the cavity of the semi finished vapor chamber 1 through the fluid injection port 100 on the first opening.

Figure 7:
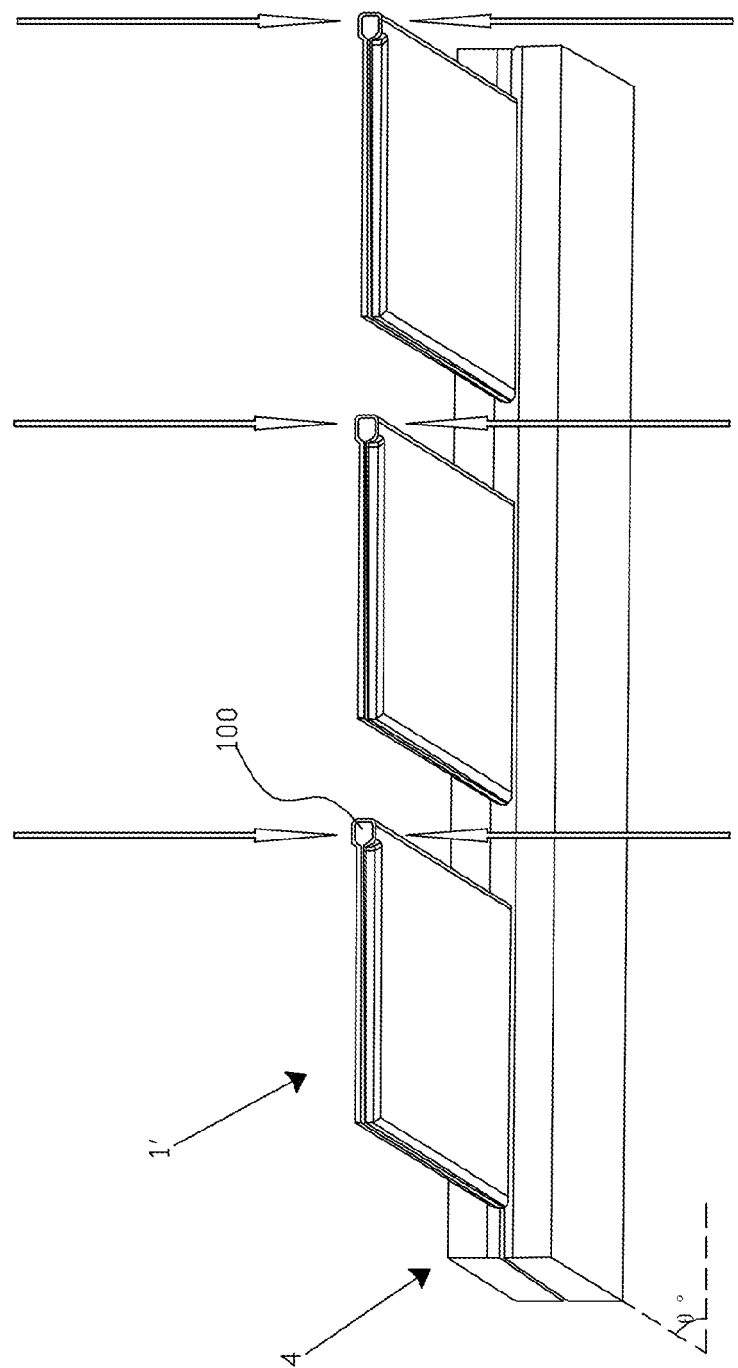
FIG. 7 is a schematic view of a semi-finished vapor chamber provided by the present invention in a vacuum chamber.

Step 7, vacuum processing: placing at least one semi finished vapor chamber 1 filled with quantified working fluid into the work holder in a vacuum chamber, pressing and sealing the fluid injection port 100, this step can be divided into:

Product positioning: placing at least one semi finished vapor chamber 1 into the work holder in the vacuum chamber and fixing it through a clamper 4 so that the fluid injection port 100 is inclined upwardly with a elevation angle θ, to avoid the working fluid in the cavity of the semi vapor chamber 1 from flowing out through the fluid injection port 100 due to the influence of gravity, as shown in FIG. 7.

The second pressing: pressing the fluid injection port 100, the direction of the pressure is shown by the narrow in FIG. 7.

Figure 8:
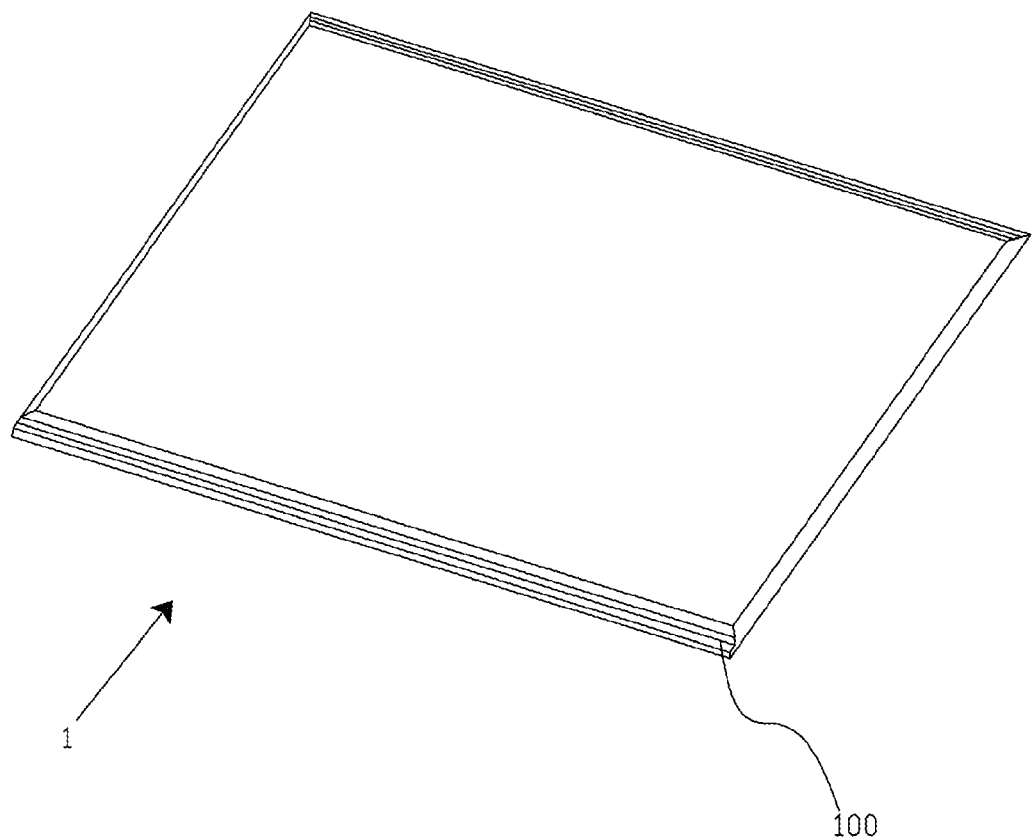
FIG. 8 is a schematic view of a sealed vapor chamber provided by the present invention.

The second sealing: sealing the fluid injection port by spot welding or other means so as to form a vapor chamber, shown as FIG. 8, after that, a vapor chamber could be further processed by other subsequent steps to form a complete heat dissipation product, which are not described herein.

It is noted that in above steps no fine metal pipe serving as a fluid injection pipe is involved, thereby avoiding problems of being unable to inject fluid or pull it out after injection due to the damage on it caused by accidental collision and pressure during manufacturing.

In the steps described above, step 7 relates to a vacuum chamber, of which main purpose is to realize the processing of vapor chamber in a vacuum environment. Thus, the vacuum chamber comprises a vacuum pumping device mounted on the inside thereof, and a control mechanism mounted on the outside thereof, such as several buttons for different functions controlling the vacuum pumping device to evacuate the air from the cavity of the vacuum chamber to form a vacuum environment. Moreover, an observation window is set on the vacuum pumping box so as to allow the operator to observe the operation of the devices. The vacuum chamber further has a controlled pressing mechanism for realize the processing steps of pressing the vapor chamber and the fluid injection port, and a controlled seal welding device for sealing the vapor chamber.

Figure 5:
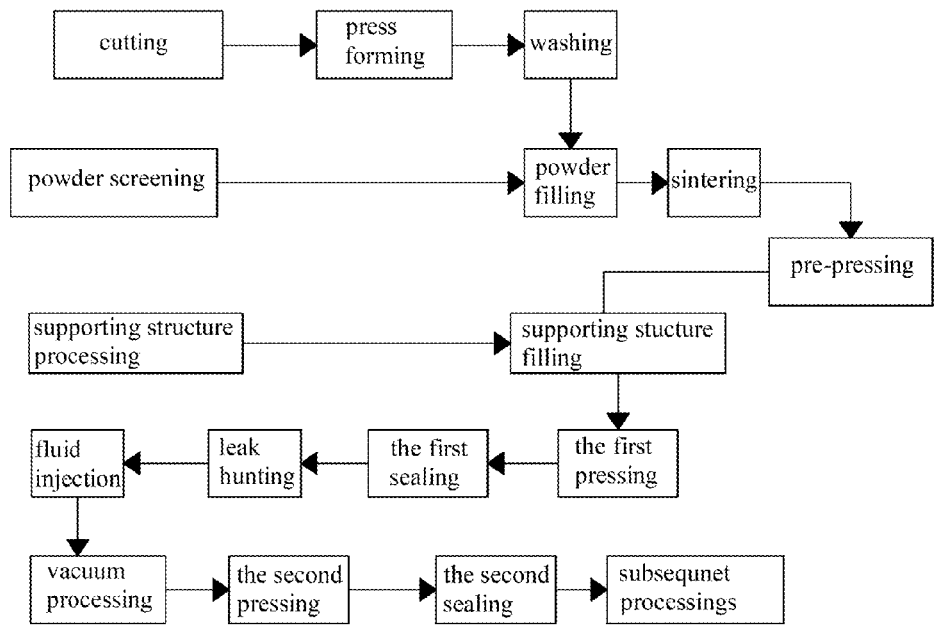
FIG. 5 is a process flow diagram of the second embodiment of the present invention.

As shown by the processing flow diagram in the FIG. 5, in the second embodiment of the present invention, a metal plate is used as the raw material for the vapor chamber, so the steps of this embodiment are different with the steps of the first embodiment, comprising:

Step 1, material preparation: preparing the raw metal material of the vapor chamber, and cutting the raw material to predetermined dimensions, as using metal plates, some substeps for processing the metal tube comprises:

Cutting: cutting the raw metal plate to predetermined dimensions; and

Punching: punching the metal plate cut into a shape required, and washing the metal plate afterwards to ensure the quality.

Step 2, powder filling and sintering: filling the cavity of the metal plate with the raw powder screened, and sintering the metal plate with the raw powder to form a capillary structure.

Step 3, supporting structure filling: filling the cavity of the metal plate with a supporting structure.

Step 4, pressing: reserving a portion of the opening of the metal plate as a fluid injection port 100, and pressing the rest of the opening of the metal plate.

Step 5, sealing: sealing the metal plate except the portion reserved as the fluid injection port 100 to form a semi finished vapor chamber 1, shown as FIG. 6.

Step 6, fluid injection: injecting the quantified working fluid into the cavity of the semi finished vapor chamber 1 through the fluid injection port 100.

Step 7, vacuum processing: as shown in FIG. 7, placing at least one semi finished vapor chamber 1 into a work holder in the vacuum pumping box, pressing and sealing the fluid injection port 100, this step can be divided into:

Product positioning: placing at least one semi vapor chamber 1 into a work holder in the vacuum pumping box and fixing it through a clamper 4 so that the fluid injection port 100 is inclined upwardly with a elevation angle θ, to avoid the working fluid in the cavity of the semi vapor chamber 1 from flowing out through the fluid injection port 100 due to the influence of gravity, as shown in FIG. 7;

The second pressing: pressing the fluid injection port 100, the direction of the pressure is shown by the narrow in in FIG. 7; and The second sealing: sealing the fluid injection port 100 by spot welding or other means so as to form a vapor chamber, shown as FIG. 8.

As the preferred embodiments of the present invention, in step 6 and step 7.3, the sealing can be realized by spot welding, arc welding, argon welding, silver brazing and other sealing methods known in the art.

In above first and second embodiments, a leak hunt is conducted after the vapor chamber is finally sealed in order to ensure the quality of the final products.

In the present invention, the sealing structure of the vapor chamber is modified, a semi-finished vapor chamber is shown in FIG. 6, and a finished vapor chamber is shown in FIG. 8, it comprises a vapor chamber 1 with a vacuum cavity, a fluid injection port 100 positioned on one side the vapor chamber 1, and a supporting structure provided in the vacuum cavity of the vapor chamber for supporting the shape of the vapor chamber, wherein the fluid injection port 100, which is the major difference from the vapor chamber produced by the conventional manufacturing methods, is integrated to the vapor chamber 1 and formed after the pressing and sealing steps.

With the manufacturing method disclosed by the present invention, the extra fine metal pipe serving as a fluid injection port is no longer required, and the subsequent sealing processing steps are integrated within a vacuum chamber.

Figure 9:
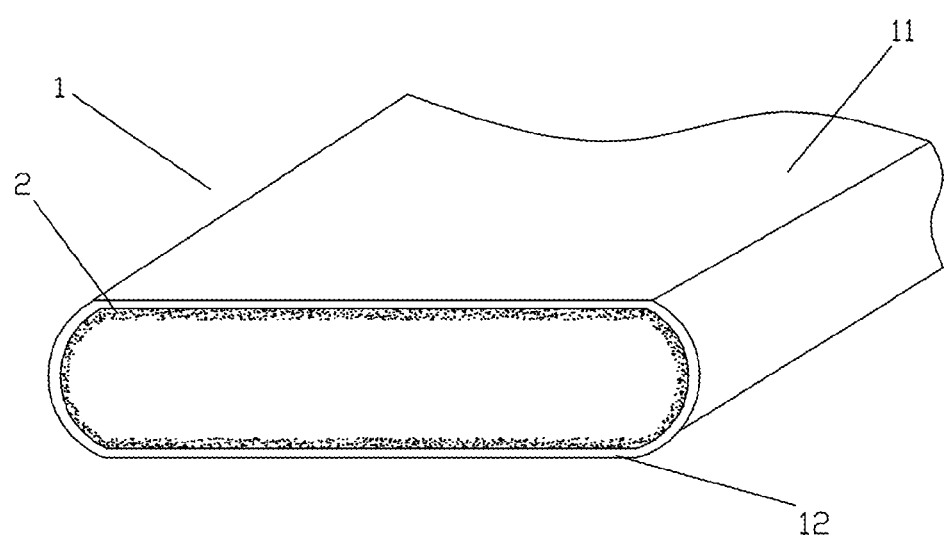
FIG. 9 is a schematic view of a metal tube provided by the present invention.
Figure 10:
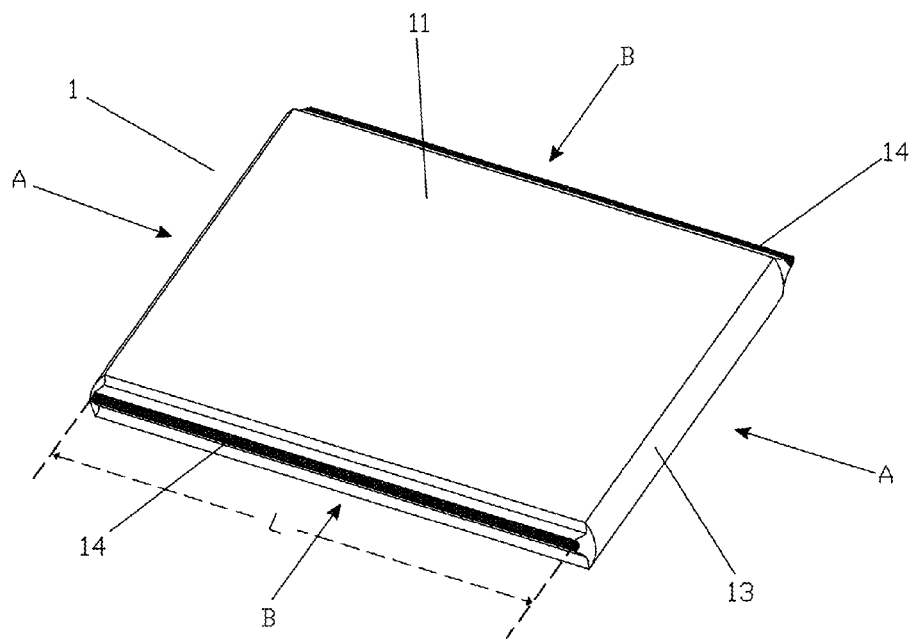
FIG. 10 is a schematic view of a vapor chamber provided by the present invention.
Figure 11:
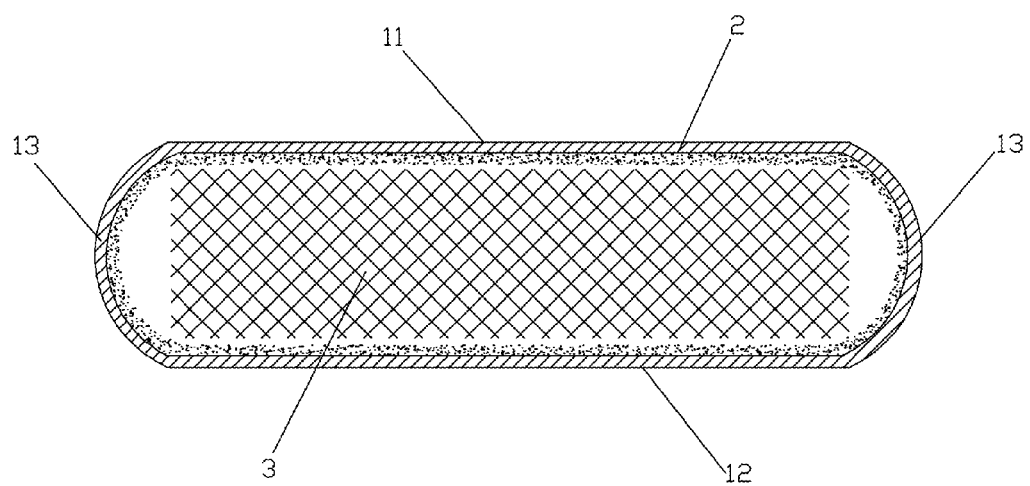
FIG. 11 is a sectional view of the section A-A in FIG. 10.
Figure 12:
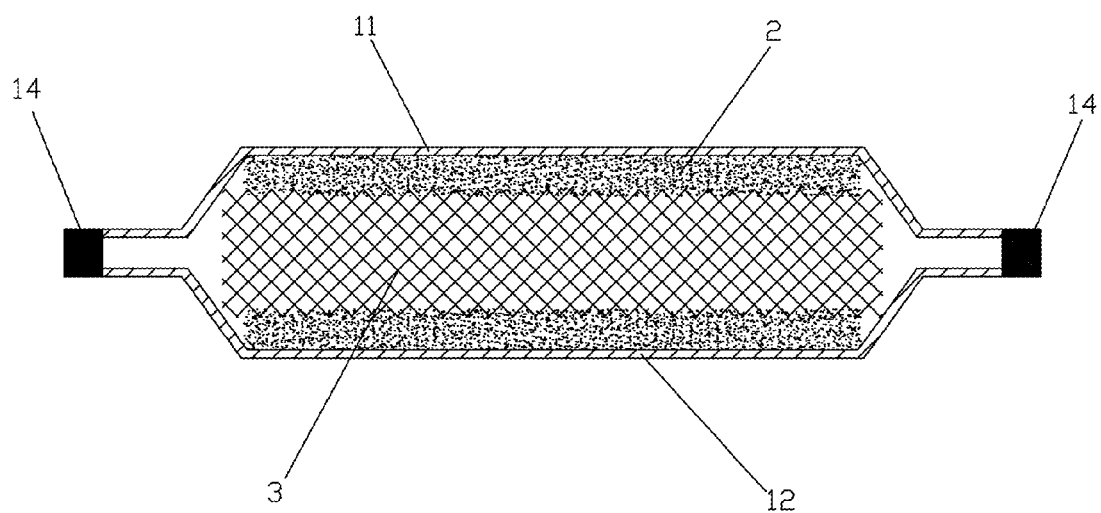
FIG. 12 is a sectional view of the section B-B in FIG. 10.

In detail, in reference to FIGS. 9, 10, 11 and 12, the vapor chamber produced according to the manufacturing method in the first embodiment of the present invention, comprises a flat metal tube (here equivalent to a finished vapor chamber) formed of a circular metal tube by pressing, a powder sintering portion on the inner wall of the metal tube, a supporting structure positioned in and surrounded by the metal tube, and a certain amount of working fluid filled in the metal tube. As the two ends of the circular metal tube are open, after the flat metal tube 1 is shaped, these two open ends become elongated correspondingly, and are sealed after pressed to form two long and narrow sealed ends 14 later on, shown as FIGS. 9 and 11. Furthermore, after flattened, the top side 11 and the bottom side 12 of the metal tube vapor chamber 1 become flat and wide, whilst the two opposite sides 13 connecting the top side 11 and bottom side 12 remain seamlessly arc shaped, as shown in FIGS. 9 and 10. The advantages of such a structure can be: the cover of the vapor chamber is made of the circular metal tube directly, but not the combination of two separated metal plates, it is easy for pressing, lowers the manufacturing costs and reduces the difficulty of manufacturing. Furthermore, for a cover formed of a metal tube, there are only two open ends (front and back), the opposite side ends 13 are naturally sealed, thus in the sealing step, there are only two ends required to be pressed and sealed to form the sealed ends 14, as shown in FIG. 9. The length of the one sealed end of the vapor chamber 1 is L (FIG. 10), equaling to a half of the length of the inner circumference of the original circular metal tube, thus the total length of the sealed ends of the metal tube vapor chamber is 2L, equaling to the length of the inner circumference of the original circular metal tube, an optimized design of minimizing the sealing length is achieved, ensuring the reliability of the sealing, simplifying the processing difficulty of sealing, improving the product rate and reducing the manufacturing costs. In addition, the final vapor chamber is better in sealing and minimizes the possibility of the working fluid leakage.

As a preferred embodiment of the present invention, the supporting structure 3 are formed by metal injection molding, which not only can reduce the time and costs for manufacturing the supporting structure, but also can provide a supporting structure with higher temperature resistance, lightened weigh and higher hardness, it could be the first choice of the supporting material for the vapor chamber.

Figure 13:
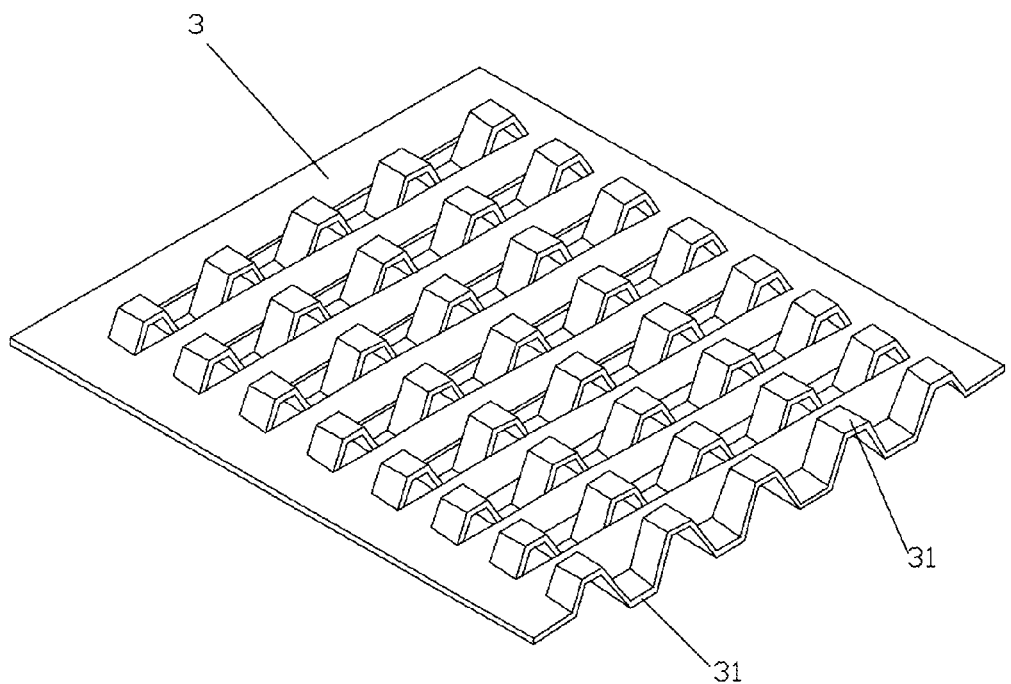
FIG. 13 is a schematic view of a supporting structure in the first embodiment of the present invention.
Figure 14:
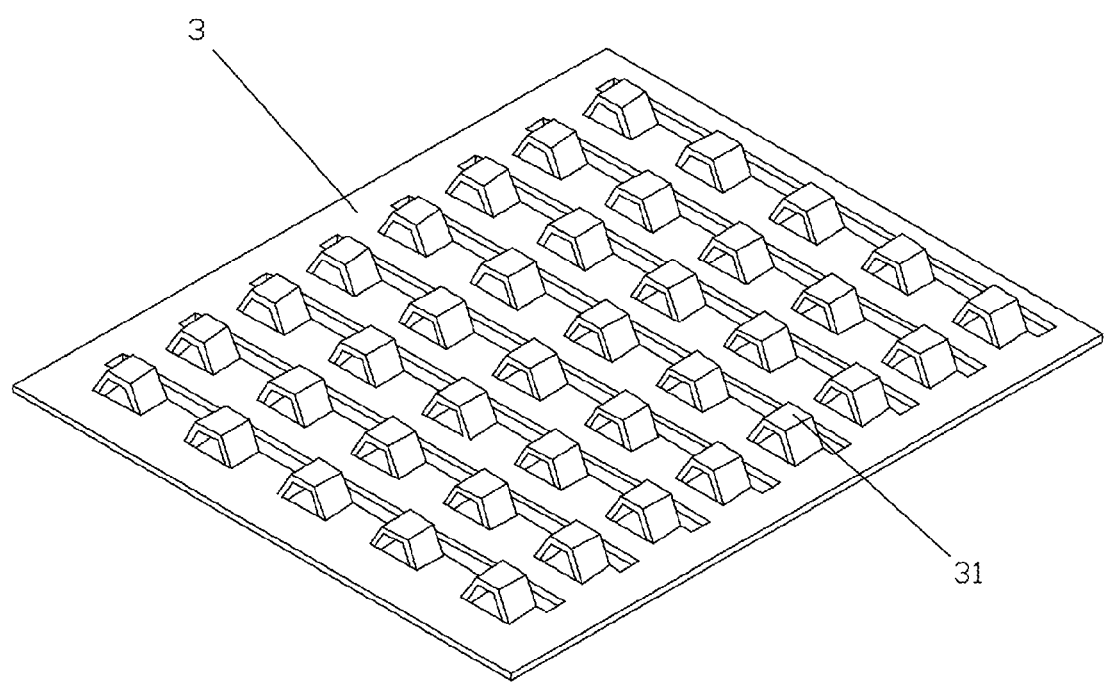
FIG. 14 is a schematic view of a supporting structure in the second embodiment of the present invention.

In order to further improve the reliability of the supporting structure 3, preferably, the supporting structure comprises a plate 3 with a plurality of projections 31. Wherein, the projections 31 which are integrated and formed by punching or other processing techniques can ensure the strength and supporting capacity of the supporting structure 3. As FIG. 13 shows, in the first embodiment of the present invention, the projections 31 are alternately distributed on both sides of the supporting structure 3 in a trapezoidal wave form, to allow each projections (wave peaks and troughs) to support the inner walls of the vapor chamber, thus the possible pressure applied on the vapor chamber will be evenly dispersed by these wave peaks and troughs to avoid the vapor chamber from collapse or deformation. In another embodiment of the present invention, said projections 31 are also in trapezoidal wave form but distributed on one side of the supporting structure 3 only, the top ends of the said projections 31 come in contact with the inner wall of the vapor chamber, a plane contact is therefore formed. Similar to the first embodiment, the arrangement of said projections can evenly disperse the pressure applied on the vapor chamber for a better supporting performance.

In addition, as a preferred embodiment, the sealed end 14 has a tin soldering layer as welding reinforcement to enhance the reliability of the product.

The preferred specifications as well as the most common specifications for the vapor chamber provided in the present invention are listed as follows: the wall thickness of the metal tube vapor chamber is between 1.0 mm and 5.0 mm, the thickness of the powder sintering portion 2 is between 0.3 mm 1.0 mm; in addition, the total thickness of the vapor chamber is between 3 mm and 12 mm, a vapor chamber with such specifications is applicable to most electronic products on the market, and its strength also satisfies the requirements of the usual use of these electronic products, its compact structure also allows the costs to be controlled into an acceptable range.

The object of the present invention is to provide a vapor chamber with enhanced product structural strength for CPU, GPU, LED solar cell, and other high heat producing electronic products to deal with the heat dissipation issues. Another object of the present invention is to simplify the production technology of the vapor chamber by adopting a circular metal tube as raw material, and achieve higher performance with an appropriate size by a more reasonable structure, therefore it could be said that the vapor chamber disclosed by the present invention has excellent performance in the fields it is involved in.

The foregoing is considered as illustrative only of the principles of the invention. Since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A vapor chamber manufacturing method, comprising:
preparing raw metal material for the vapor chamber, cutting said raw metal material to predetermined dimensions and punching the raw metal material to form a metal tube, and inserting a mold rod matched with an internal diameter of said metal tube into a cavity of said metal tube;
filling the cavity of said metal tube with a raw powder screened and sintering said metal tube after filling, and removing said mold rod from said sintered metal tube;
pressing said metal tube to a flat shape having two openings and filling the cavity of said pressed metal tube with a supporting structure;
reserving one portion of one opening of said pressed metal material as a fluid injection port and pressing the rest of the opening to seal the one opening except the portion of the opening reserved as a fluid injection port forming a reserved opening;
injecting a quantified amount of working fluid into the cavity through said fluid injection port to form a semi-finished vapor chamber; and
preparing a vacuum chamber comprising a vacuum pumping device, a pressing device, a seal welding device, and an observation window for an operator to observe internal conditions in the vacuum chamber, and forming a finished vapor chamber by placing at least one semi-finished vapor chamber into said vacuum chamber, and pressing and sealing said fluid injection port of said semi-finished vapor chamber.

2. The vapor chamber manufacturing method according to claim 1, wherein the forming of a finished vapor chamber comprises:
placing the at least one semi finished vapor chamber in a work holder mounted in said vacuum chamber;
pressing an end of said fluid injection port of the semi-finished vapor chamber with said pressing device in said vacuum chamber; and
sealing said pressed fluid injection port of said semi-finished vapor chamber with said seal welding device in said vacuum chamber.

3. The vapor chamber manufacturing method according to claim 1, wherein the semi finished vapor chamber is fixed in a work holder mounted in said vacuum chamber so as to ensure said fluid injection port is inclined upwardly with an elevation angle.

4. The vapor chamber manufacturing method according to claim 1, wherein said raw metal material is straightened prior to cutting.

5. The vapor chamber manufacturing method according to claim 1, wherein said raw metal material is a metal plate, and wherein said cutting of said metal plate further comprises cutting said metal plate to predetermined dimensions and punching said cut metal plate to a required shape.

6. The vapor chamber manufacturing method according to claim 1, further comprising hunting for leak after sealing the one opening.

7. The vapor chamber manufacturing method according to claim 1, wherein the sealing the opening occurs by spot welding, arc welding or other welding manners.

8. The vapor chamber manufacturing method according to claim 2, wherein said fluid injection port is sealed by spot welding, arc welding or other welding manners.

* * * * *